United States Patent [19]

Takahashi

[11] 4,377,144

[45] Mar. 22, 1983

[54] INJECTOR DRIVING CIRCUIT

[75] Inventor: Yukiharu Takahashi, Yokohama, Japan

[73] Assignee: Tokyo Shibaura Denki Kabushiki Kaisha, Kawasaki, Japan

[21] Appl. No.: 299,135

[22] Filed: Sep. 3, 1981

[30] Foreign Application Priority Data

Sep. 8, 1980 [JP] Japan .................. 55-124241

[51] Int. Cl.³ .................. F02B 3/00; F02M 7/00
[52] U.S. Cl. .................. 123/490; 361/152; 361/154
[58] Field of Search .................. 123/490; 361/152, 153, 361/154

[56] References Cited

U.S. PATENT DOCUMENTS

| | | | |
|---|---|---|---|
| 4,180,026 | 12/1979 | Schulzke | 123/490 |
| 4,345,296 | 8/1982 | Breitling | 361/154 |
| 4,345,564 | 8/1982 | Kawamura | 123/490 |
| 4,347,544 | 8/1982 | Ohba | 361/154 |

*Primary Examiner*—Ronald B. Cox
*Attorney, Agent, or Firm*—Finnegan, Henderson, Farabow, Garrett & Dunner

[57] ABSTRACT

An injector driving circuit includes a first diode forwardly coupled between one end of a solenoid coil and a positive power supply terminal, a capacitor with one end grounded, a second diode forwardly coupled between the other end of the coil and the capacitor with respect to the positive power supply terminal, a switching transistor coupled between the other end of the coil and the ground and connected to be turned on in response to a driving input signal, a current detecting circuit for detecting current flowing through the coil and producing an output signal when detecting that the coil current has reached a predetermined value, and a switching circuit coupled between the one end of the coil and the other end of the capacitor and connected to be closed and opened in response to the driving input signal and the output signal of the current detecting circuit, respectively.

10 Claims, 24 Drawing Figures

FIG. 8
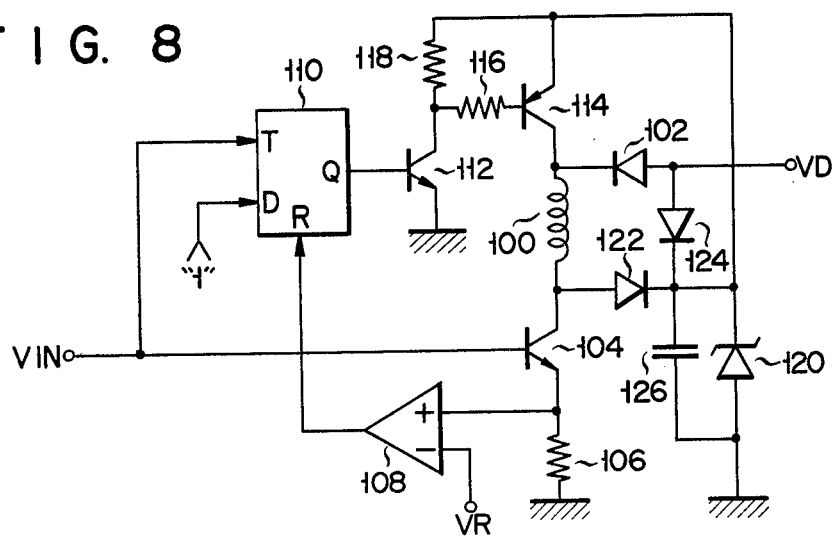
FIG. 9A
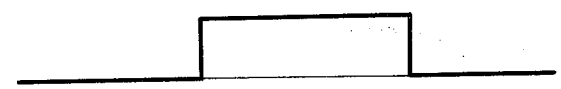
FIG. 9B
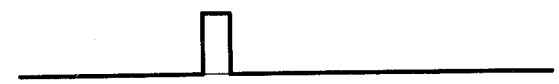
FIG. 9C
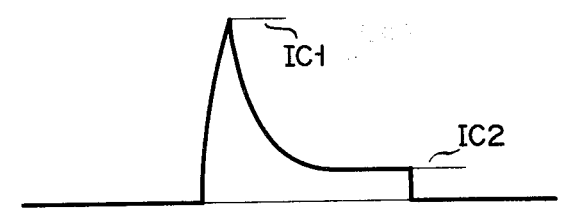
FIG. 9D
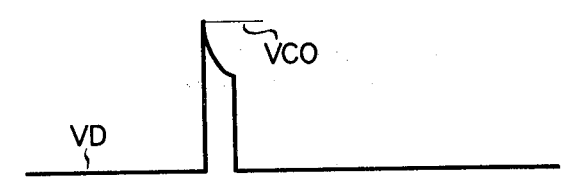
FIG. 9E

INJECTOR DRIVING CIRCUIT

BACKGROUND OF THE INVENTION

This invention relates to an injector driving circuit.

With the tendency toward the electronic control of automobiles of these days, electronic fuel injection (EFI) systems have come to be used for direct injection of fuel into combustion chambers of engines instead of using carburetors. FIG. 1A shows a positional relationship between an EFI device 1 and an engine body. FIG. 1B shows an outline of one such EFI system. As shown in FIG. 1B, fuel under pressure is fed from a fuel tank (not shown) through a fuel feed pipe 2, and injected into a combustion chamber 4 of an engine through a valve 6. In conjunction with a solenoid coil 8 controlled by an injector driving circuit 10, the valve 6 constitutes a solenoid valve or solenoid-type injector 1 shown in FIG. 1A for injecting fuel into the combustion chamber 4.

In the EFI system of this type, for example, the period for which the solenoid coil 8 is energized need be set in direct proportion to the amount of fuel injected into the combustion chamber 4. To attain this, it is necessary that the rise of current pulse for enegizing the solenoid coil 8 be made steep so that the solenoid coil 8 may be quickly brought to a pull-on state to promptly displace the valve 6 from its initial position to the operating position as illustrated, and that the fall of the current pulse be made sharp so that the solenoid coil 8 may be quickly brought to a pull-off state to promptly return the valve 6 to the initial position, thereby suddenly stopping the fuel injection. Fuel injection will be delayed if the rise of the energizing current pulse is dull, while fuel cutoff will be delayed if the trailing edge of the current pulse is dull. If the fuel injection and cutoff are thus delayed, then hydrocarbon, carbon monoxide, nitric oxides, etc. contained in exhaust gas will be increased in concentration, or fuel consumption will be increased. Accordingly, the injector driving circuit 10 need be constructed in compliance with these requirements.

FIG. 2 is a circuit diagram of a prior art injector driving circuit. This injector driving circuit includes an npn transistor 12 whose collector is coupled to one end of the solenoid coil 8 the other end of which is coupled to a power supply terminal $V_D$, whose base is coupled to an input terminal $V_{IN}$, and whose emitter is grounded, and a Zener diode 14 coupled in a reverse direction between the one end of the coil 8 and the ground.

When a driving voltage as shown in FIG. 3A is applied to the input terminal $V_{IN}$ of the driving circuit shown in FIG. 2, the transistor 12 is turned on to cause a current as shown in FIG. 3B to flow through the coil 8. As a result, the coil 8 is brought to the pull-on state to hold the valve 6 in the operating position shown in FIG. 1, for example. Thereafter, when the level of the driving voltage goes low to turn off the transistor 12, the current energy at the coil 8 passes through the Zener diode 14. At the point of time when the driving voltage is reduced to the low level, the collector voltage of the transistor 12 suddenly rises from the ground potential level to the level of a Zener breakdown voltage $V_Z$, as shown in FIG. 3C, and then drops to the level of a power supply voltage $V_D$. When the coil current is reduced below a predetermined value, the coil 8 is brought to the pull-off state, and the valve 6 is returned to the initial position by the agency of e.g. a spring (not shown).

In the above-mentioned driving circuit, the time required for the current flowing through the coil 8 when the driving voltage shown in FIG. 3A is applied to reach a predetermined value, that is, a value great enough to displace the valve 6, depends upon the time constant of a circuit including the coil 8 and the transistor 12, and the magnitude of a voltage applied to the power supply terminal $V_D$. In the circuit shown in FIG. 2, it is impossible to apply a very high voltage to the power supply terminal $V_D$, so that it takes relatively long time for the coil current to reach the predetermined value, eventually causing the operation of the valve 6 to be delayed. In this case, in order to quickly attain a pull-on state, a current much greater than the necessary current to keep the coil 8 in the pull-on state would flow through the coil 8 and the transistor 12 while the transistor 12 is conducting. If a resistor is coupled to the coil 8 in order to avoid such awkwardness, a power loss will be caused at the resistor, and the value of the resistor should be carefully selected with high accuracy so that a sufficiently great coil current may be obtained despite the variation of battery voltage. Further, the current energy stored in the coil 8 after the level of the driving voltage goes low would be discharged through the Zener diode 14, resulting in a greater power loss.

FIG. 4 shows a prior art injector driving circuit designed so that the current flowing through the solenoid coil 8 at operation may be kept constant. This injector driving circuit includes an npn transistor 20 whose collector is coupled to the coil 8 and whose emitter is grounded through a resistor 22, a comparing circuit 24 whose inverted input terminal is coupled to the emitter of the transistor 20, whose non-inverted input terminal is coupled to a reference voltage terminal $V_R$, and whose output terminal is coupled to the base of the transistor 20, and an npn transistor 26 whose collector is coupled to the base of the transistor 20 through a resistor 28 and whose emitter is grounded. The base of the transistor 26 is coupled with the input terminal $V_{IN}$ through an inverter 32, and Zener diode 30 is coupled in a reverse direction between the coil 8 and the ground.

In the injector driving circuit shown in FIG. 4, the transistors 26 and 20 are respectively set in conductive and nonconductive states while a low-level driving voltage is being applied to the input terminal $V_{IN}$. When a high-level driving signal is applied to the input terminal $V_{IN}$, as shown in FIG. 5A, the transistor 26 is turned off, and the output voltage of the comparing circuit 24 is applied to the base of the transistor 20. As a result, a coil current flows through the coil 8, transistor 20, and resistor 22, as shown in FIG. 5B. When a voltage drop at the resistor 22 exceeds a reference voltage $V_R$, a low-level output voltage is delivered from the comparing circuit 24 to turn off the transistor 20. If the resistance value of the resistor 22 is R1, the coil current is eventually kept at $V_R/R1$. In this case, the collector voltage of the transistor 20 is reduced to zero level at the leading edge of the driving voltage, as shown in FIG. 5C, and is maintained at a constant value after gradually increasing until the coil current becomes constant. Thereafter, when the driving voltage is reduced to low level, the transistor 20 is turned off, and the coil current flowing at that time flows through the Zener diode 30, and the collector current of the transistor 20 is gradually reduced to a voltage $V_D$ after once increasing to a Zener voltage.

Capable of easily setting the coil current to a relatively small value, the injector driving circuit of FIG. 4 has an advantage over the injector driving circuit shown in FIG. 2. Since the transistor 20 is, however, operated in a linear region, a great power loss will be caused at the transistor 20. Further, the slow rising response of the coil current is not improved yet.

FIG. 6 is a circuit diagram of a prior art injector driving circuit intended to eliminate the drawbacks of the injector driving circuit of FIG. 4. The injector driving circuit of FIG. 6 has the same construction as that of the one shown in FIG. 4 except that, in the circuit of FIG. 6, the reference voltage applied to the comparing circuit 24 is made variable according to the magnitude of the current flowing through the coil 8. Namely, the injector driving circuit of FIG. 6 additionally includes an R-S flip-flop circuit 34 whose set input terminal is coupled to the emitter of the transistor 20 and whose reset input terminal is coupled to the input terminal $V_{IN}$ through an inverter 32, an npn transistor 36 whose base is coupled to the Q output terminal of the flip-flop circuit 34 and whose emitter is grounded, and three resistors 38, 40 and 42 coupled in series between a power supply terminal $V_C$ and the ground. A junction between the resistors 38 and 40 is coupled to the non-inverted input terminal of the comparing circuit 24, while a junction between the resistors 40 and 42 is coupled to the collector of the transistor 36.

When the driving voltage is at a low level, the transistor 20 is kept in the nonconductive state, as aforesaid, and the flip-flop circuit 34 is brought to a reset state to keep the transistor 36 in the nonconductive state. As a result, a first reference voltage $V_{R1}$ is applied to the non-inverted input terminal of the comparing circuit 24. When the driving voltage reaches high level, as shown in FIG. 7A, the transistor 20 is turned on by the high-level output voltage from the comparing circuit 24, as mentioned before, and a current flows through the coil 8, transistor 20, and resistor 22, as shown in FIG. 7B. When the voltage drop at the resistor 22 reaches the first reference voltage $V_{R1}$, a low-level output voltage is delivered from the comparing circuit 24 to turn off the transistor 20. At the same time, the flip-flop circuit 34 is set to deliver a high-level output signal as shown in FIG. 7C from its Q output terminal, thereby causing the transistor 36 to conduct. Thus, a second reference voltage $V_{R2}$ lower than the first reference voltage $V_{R1}$ is applied to the non-inverted input terminal of the comparing circuit 24, as shown in FIG. 7D. Accordingly, the coil current is kept constant at $V_{R2}/R1$. As shown in FIG. 7E, the collector voltage of the transistor 20 changes in the same manner as in the case of the injector driving circuit of FIG. 4.

In the injector driving circuit of FIG. 6, the high-level reference voltage $V_{R1}$ is used in the initial stage, so that the rise of the coil current can be made steep by suitably determining the electrical characteristics of the coil 8, transistor 20, and resistor 22. Since the reference voltage is changed to the low-level reference voltage $V_{R2}$ after the initial stage, the coil current required to keep the coil 8 in the pull-on state can be set to a relatively small value ($V_{R2}/R1$) which depends on the reference voltage $V_{R2}$ and the value of the resistor 22. Even in the injector driving circuit shown in FIG. 6, however, the transistor 20 operates in a linear region, so that the problem of power loss at the transistor 20 is not solved yet. Moreover, when the level of the driving voltage again goes low to turn off the transistor 20, the current having so far been flowing through the coil 8 will be discharged through the Zener diode 30 to the ground to be wasted.

SUMMARY OF THE INVENTION

The object of this invention is to provide an injector driving circuit with improved energy efficiency.

According to an aspect of this invention, there is provided an injector driving circuit which comprises a first diode circuit coupled between one end of a solenoid coil of an injector to be driven and a power supply terminal to permit the one end of the solenoid coil to be supplied with a power supply voltage, first switching means coupled between the other end of the coil and a reference voltage terminal to control the state of conduction of the coil in accordance with a driving input signal, current detecting means producing an output signal when detecting that current flowing through the coil has reached a predetermined value, capacitive means with one end coupled to the reference voltage terminal, second switching means coupled between the one end of the coil and the other end of the capacitive means to be controlled in its state of conduction in response to the driving input signal and the output signal from the current detecting means, and a second diode circuit coupled between the other end of the coil and the other end of the capacitive means to allow current to flow from the coil to the capacitive means.

In this invention, when the first and second switching means are turned on, a coil current is caused to flow through the coil with a sharp rise characteristic by the charged voltage across the capacitive means. Thereafter, when the second and first switching means are turned off in this order, the current having so far been flowing through the coil flows into the capacitive means to raise the charged voltage thereon. The charged voltage across the capacitive means is used for instantaneously passing a great current through the coil in the next cycle.

BRIEF DESCRIPTION OF THE DRAWINGS

FIG. 8 is a circuit diagram of an injector driving circuit according to an embodiment of this invention;

FIGS. 9A to 9E show signal waveforms for illustrating the operation of the injector driving circuit of FIG. 8;

DETAILED DESCRIPTION OF THE PREFERRED EMBODIMENTS

Figure 1A:
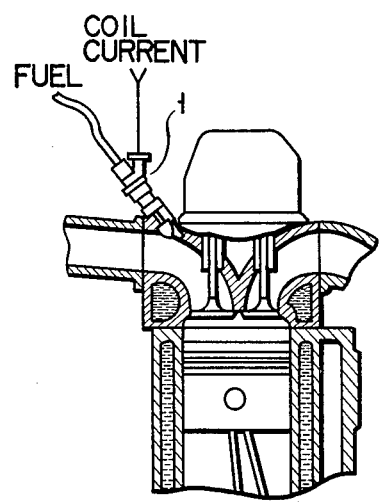
FIG. 1A is a schematic view illustrating an arrangement of an electronic fuel injector and an engine body.
Figure 1B:
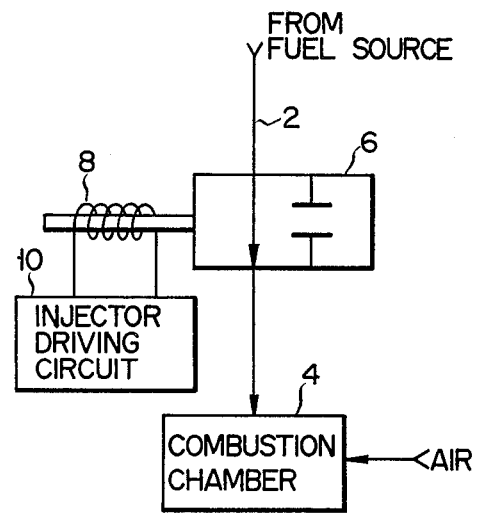
FIG. 1B is a schematic view for explaining the function of a well-known electronic fuel injection system.
Figure 2:
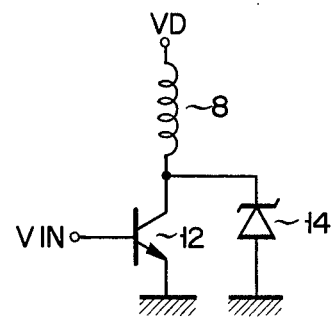
FIG. 2 is a circuit diagram of an injector driving circuit used in the electronic fuel injection system of FIG. 1.
Figure 3A:
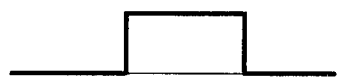
FIGS. 3A to 3C show signal waveforms for illustrating the operation of the injector driving circuit of FIG. 2.
Figure 3B:
Figure 3C:
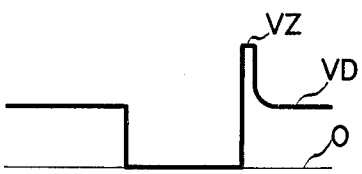
Figure 4:
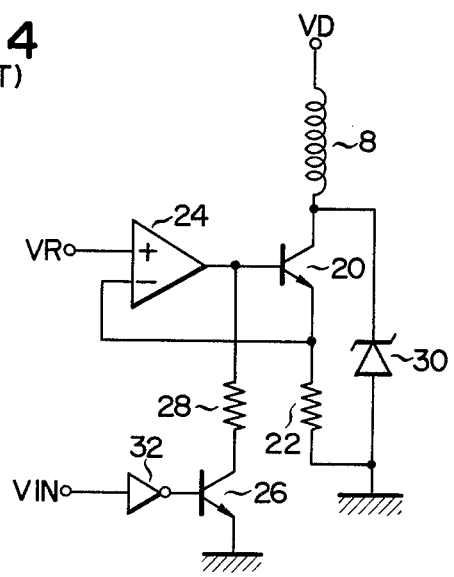
FIG. 4 is a circuit diagram of a prior art injector driving circuit capable of controlling current flowing through a solenoid coil.
Figure 5A:
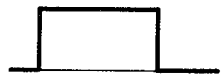
FIGS. 5A to 5C show signal waveforms for illustrating the operation of the injector driving circuit of FIG. 4.
Figure 5B:
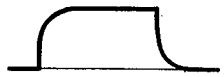
Figure 5C:
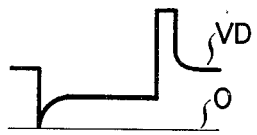
Figure 6:
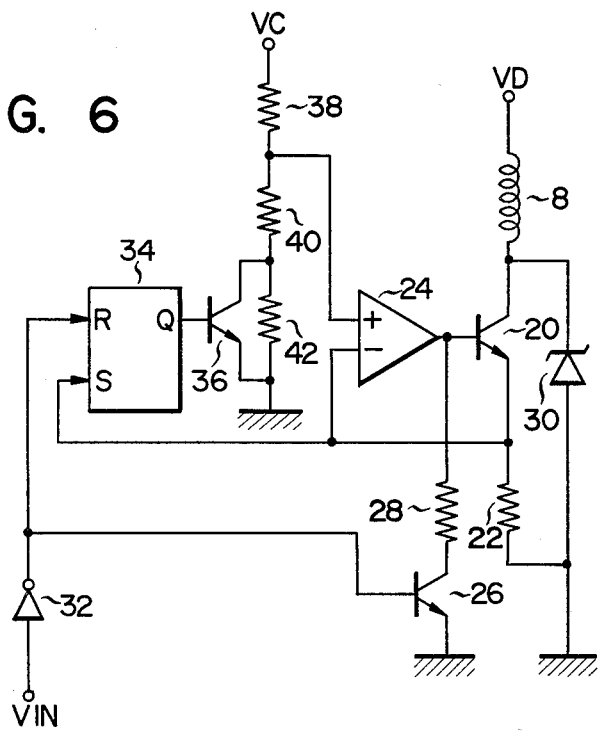
FIG. 6 is a circuit diagram of a prior art injector driving circuit capable of supplying a solenoid coil with a coil current with a satisfactory rise characteristic.
Figure 7A:
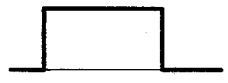
FIGS. 7A to 7E show signal waveforms for illustrating the operation of the injector driving circuit of FIG. 6.
Figure 7B:
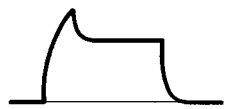
Figure 7C:
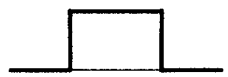
Figure 7D:
Figure 7E:
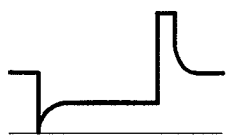

FIG. 8 shows an injector driving circuit according to an embodiment of this invention. This injector driving circuit includes a solenoid coil 100 with one end coupled to the cathode of a diode 102 whose anode is coupled to a power supply terminal $V_D$, an npn transistor 104 whose collector is coupled to the other end of the solenoid coil 100, whose base is coupled to an input terminal $V_{IN}$, and whose emitter is grounded through a resistor 106, and a comparing circuit 108 having a non-inverted input terminal coupled to the emitter of the transistor 104 and an inverted input terminal to which a reference voltage $V_R$ is applied. The output terminal of the comparing circuit 108 is coupled to the reset input terminal R of a flip-flop circuit 110 which, having its trigger input terminal T coupled to the driving signal receiving terminal $V_{IN}$, receives a logic signal "1" at its data input terminal D. The output terminal Q of the flip-flop circuit 110 is coupled to the base of an npn transistor 112 whose emitter is grounded. The collector of the transistor 112 is coupled to the base and emitter of a pnp transistor 114 through resistors 116 and 118, respectively. The transistor 114 has its collector coupled to a junction between the coil 100 and the diode 102, and its emitter grounded through a Zener diode 120. The cathode of the Zener diode 120 is coupled to the cathode of a diode 122 whose anode is coupled to the other end of the coil 100. Further, a diode 124 is coupled between the power supply terminal $V_D$ and the diode 122, and a capacitor 126 is coupled in parallel with the Zener diode 120.

In the injector driving circuit shown in FIG. 8, the flip-flop circuit 110, the transistors 112 and 114, and the resistors 116 and 118 constitute a switching circuit. Namely, when a high-level driving signal is supplied to the input terminal $V_{IN}$, a high-level output signal is delivered from the Q output terminal of the flip-flop circuit 110 to cause the transistors 112 and 114 to be rendered conductive. Meanwhile, when a voltage drop at the resistor 106 exceeds the reference voltage $V_R$, a high-level signal is generated from the comparing circuit 108 to reset the flip-flop circuit 110, turning off the transistors 112 and 114.

Referring now to the signal waveforms of FIGS. 9A to 9E, there will be described the operation of the injector driving circuit shown in FIG. 8. Now, suppose that, as shown in FIG. 9A, the capacitor 126 is charged to the voltage applied to the power supply terminal $V_D$, usually a voltage $V_{CO}$ sufficiently higher than 10 to 20 V, e.g. to hundreds of volts. Under such circumstance, when a high-level driving voltage as shown in FIG. 9B is supplied to the input terminal $V_{IN}$, the transistor 104 is turned on, and the Q output signal of the flip-flop circuit 110 reaches high level, as shown in FIG. 9C, allowing the transistors 112 and 114 to be made conductive. As a result, part of the charge in the capacitor 126 is discharged through the transistor 114, coil 100, transistor 104, and resistor 106, as shown in FIG. 9A, and a coil current $I_C$ exhibiting a steep rise as shown in FIG. 9D flows through the coil 100. At the same time, the collector voltage of the transistor 114 increases from the power supply voltage $V_D$ to the charging voltage $V_{CO}$ at the capacitor 126, as shown in FIG. 9E, and then gradually decreases according to the discharge operation of the capacitor 126. Thereafter, when the coil current $I_C$ reaches a predetermined value $I_{C1}$, the voltage drop at the resistor 106 becomes greater than the reference voltage $V_R$, causing a high-level output signal to be delivered from the comparing circuit 108 to reset the flip-flop circuit 110. In consequence, the Q output signal is reduced to low level, as shown in FIG. 9C, to turn off the transistors 112 and 114. When the transistor 114 is turned off, the capacitor 126 ceases to be discharged and the voltage across the capacitor 126 is kept at a constant value, as shown in FIG. 9A, and the collector voltage of the transistor 114 is reduced again to the power supply voltage $V_D$, as shown in FIG. 9E. In this case, the coil current $I_C$ gradually decreases from the given current value $I_{C1}$ to a current value $I_{C2}$ ($=V_D/R_L$ where $R_L$ is sufficiently greater than the resistance value of the resistor 106) which depends upon the power supply voltage $V_D$ and the resistance $R_L$ of the coil 100, and is then kept constant at the current value $I_{C2}$, as shown in FIG. 9D.

Subsequently, when the level of the driving voltage goes low, as shown in FIG. 9B, the transistor 104 is turned off. As a result, the current energy at the coil 100 instantaneously charges the capacitor 126 through the diode 122. Namely, the remaining current energy at the coil 100 is stored as electrostatic energy in the capacitor 126. Thus, the coil current $I_C$ is drastically reduced to zero, as shown in FIG. 9E, while the capacitor 126 is charged again to the high voltage $V_{CO}$, as shown in FIG. 9A.

Thereafter, the injector driving circuit repeats the above-mentioned operation every time the driving signal as shown in FIG. 9B is applied to the input terminal $V_{IN}$.

In the initial state, or immediately after the power supply voltage is supplied to the circuit, the capacitor 126 is charged through the diode 124 with a relatively low voltage which is applied to the power supply terminal $V_D$, and the coil current $I_C$ exhibits a relatively gentle rise in the initial stage of the operation. After the passage of a given time or a few operation cycles, however, the capacitor 126 is charged with the high voltage as aforesaid, and the coil current $I_C$ exhibits a steep rise. The Zener diode 120 prevents an extraordinarily high voltage from being applied to the capacitor 126.

In this embodiment of the invention, as described above, the rising and falling response of the coil current $I_C$ are quite satisfactory. After a driving signal for one cycle is supplied, the current energy provided by the current which has so far been flowing through the coil 100 is converted into electrostatic energy and stored in the capacitor 126. Since the electrostatic energy can be used for energizing the coil 100 in the next cycle, the battery used can be saved. Moreover, since the transistors 104 and 114 are used as switching elements, heat loss in these transistors is minimized. Therefore, transistors with small capacity can be used for the transistors 104 and 114, ensuring a reduction in power consumption. During the normal operation, the value of the peak current $I_{C1}$ to flow through the coil 100 can be set independently of the battery voltage or the voltage applied to the power supply terminal $V_D$. Namely, since the peak current $I_{C1}$ can be obtained by applying the charged voltage across the capacitor 126 to the coil 100, the resistance of the coil 100 can be made large. As a result, the rising response of the coil current $I_C$ can be improved, and the holding current $I_{C2}$ required to maintain the energized state of the coil 100 can be set to a sufficiently small value.

Figure 10:
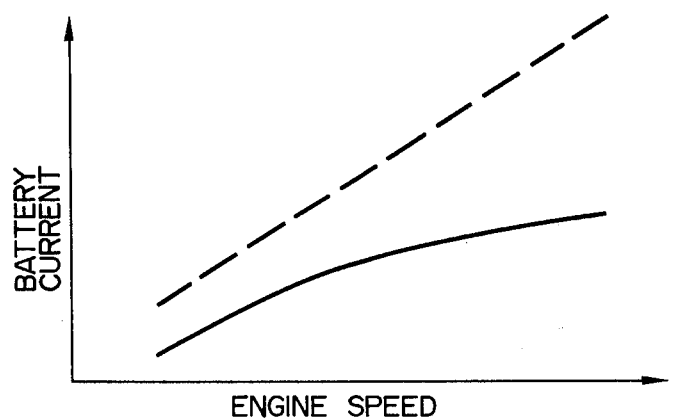
FIG. 10 is a graph showing the relationships between the battery current and engine speed used with the prior art injector driving circuit and the injector driving circuit according to the invention.

FIG. 10 shows the relationships between the engine speed or driving input signal frequency and the battery current consumption of the prior art injector driving circuit and the injector driving circuit shown in FIG. 8. As represented by a broken line in FIG. 10, the current consumption increases substantially in direct proportion to the engine speed in the prior art injector driving circuit. In the injector driving circuit according to the invention, on the other hand, the current consumption increases only gradually as the engine speed increases, as represented by a solid line. This is because the current having been flowing through the coil 100 is converted into electrostatic energy to be used in the next cycle when the transistor 104 is turned off, and because the transistors 104 and 114 perform switching operations even while the engine is in a high-speed operation. Thus, the injector driving circuit of the invention can enjoy extremely high energy efficiency.

Figure 11:
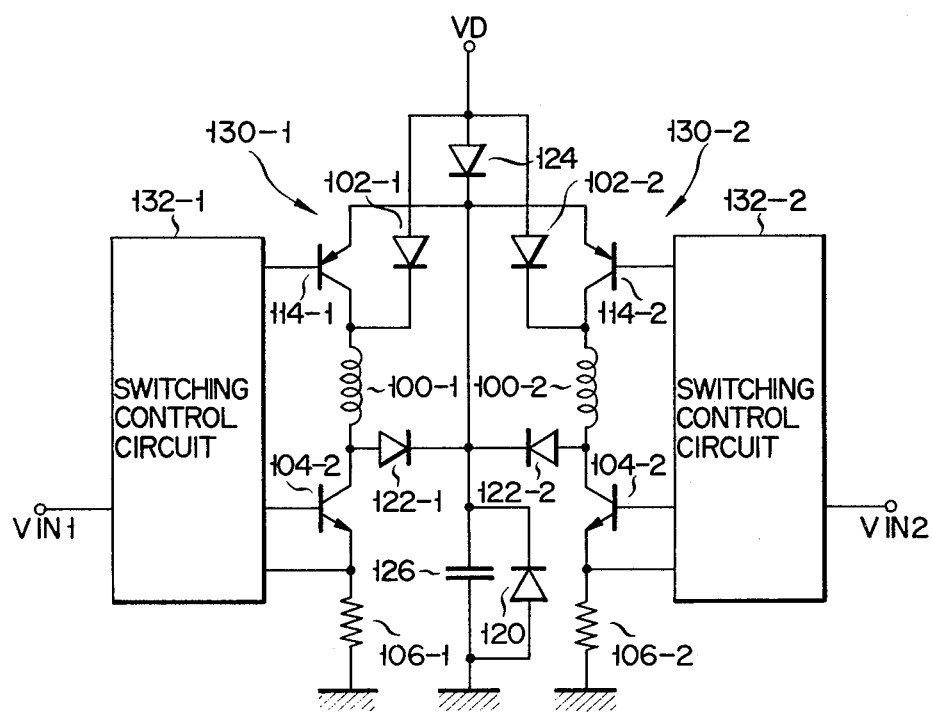
FIG. 11 is a circuit diagram of an injector driving circuit according to another embodiment of the invention.

Although an illustrative embodiment of this invention has been described in detail herein, the invention is not limited to such embodiment. The injector driving circuit shown in FIG. 8 is intended to drive a single solenoid coil 100. Alternatively, however, it is possible to construct an injector driving circuit for driving a plurality of solenoid coils. For example, FIG. 11 shows an injector driving circuit for driving two solenoid coils 100-1 and 100-2. The injector driving circuit shown in FIG. 11 includes driving circuit sections 130-1 and 130-2 which are each constructed in the same manner as the injector driving circuit of FIG. 8 is. These driving circuit sections 130-1 and 130-2 have a Zener diode 120, a diode 124, and a capacitor 126 in common. The remaining portions of the driving circuit sections 130-1 and 130-2 have the same constructions as those of their corresponding portions of the injector driving circuit shown in FIG. 8. In FIG. 11, switching control circuits 132-1 and 132-2 each have the same construction as that of the circuit formed of the comparing circuit 108, flip-flop circuit 110, transistor 112, and resistors 116 and 118 in the injector driving circuit of FIG. 8.

In the injector driving circuit shown in FIG. 11, for example, the driving signal as shown in FIG. 9B is time-sequentially supplied to input terminals $V_{IN1}$ and $V_{IN2}$ to energize the solenoid coils 100-1 and 100-2 selectively.

Although a positive voltage is applied to the power supply terminal $V_D$ in the injector driving circuit of FIG. 8, a negative voltage may also be applied to the power supply terminal $V_D$ by a simple modification of circuit design, such as a change of polarity of the transistors 112 and 114 or inversion of polarity of the diodes 102, 120, 122 and 124.

Furthermore, the diode 124 and the Zener diode 120 may be removed from the injector driving circuit of FIG. 8.

What is claimed is:

1. An injector driving circuit comprising:
a power supply voltage terminal and a reference voltage terminal;
a first diode circuit coupled between one end of a solenoid coil of an injector to be driven and said power supply voltage terminal to supply said one end of said solenoid coil with a power supply voltage applied to said power supply voltage terminal;
first switching means coupled between the other end of said solenoid coil and said reference voltage terminal to control the current conducting state of said solenoid coil in accordance with a driving input signal;
current detecting means producing an output signal when detecting that current flowing through said solenoid coil has reached a predetermined value;
charge storing means with one end coupled to said reference voltage terminal;
second switching means coupled between said one end of said solenoid coil and the other end of said charge storing means and connected to be turned on and off in resonse to the driving input signal and the output signal from said current detecting means, respectively; and
a second diode circuit coupled between said other end of said solenoid coil and said other end of said charge storing means to allow current to flow from said solenoid coil to said charge storing means.

2. An injector driving circuit according to claim 1, further comprising a Zener diode whose cathode is coupled to said other end of said charge storing means and whose anode is coupled to said reference voltage terminal.

3. An injector driving circuit according to claim 1 or 2, further comprising a third diode circuit coupled between said power supply voltage terminal and said other end of said charge storing means to supply said other end of said charge storing means with the power supply voltage applied to said power supply voltage terminal.

4. An injector driving circuit according to claim 1 or 2, wherein said current detecting means includes a resistor coupled in series with said solenoid coil and a comparing circuit producing an output signal when a voltage drop at said resistor reaches a predetermined voltage level.

5. An injector driving circuit according to claim 4, wherein said second switching means includes a flip-flop circuit producing a first output signal in response to the driving input signal and producing a second output signal in response to the output signal from said comparing circuit, and a switching circuit turned on and off in response to said first and second output signals from said flip-flop circuit, respectively.

6. An injector driving circuit comprising:
a power supply voltage terminal and a reference voltage terminal;
a plurality of first diode circuits coupled between respective one ends of solenoid coils of a plurality of injectors to be driven and said power supply voltage terminal to supply said one ends of said solenoid coils with a power supply voltage applied to said power supply voltage terminal;
a plurality of first switching means coupled between the respective other ends of said solenoid coils and said reference voltage terminal to control the current conducting state of said solenoid coils in accordance with a driving input signal;
a plurality of current detecting means each producing an output signal when detecting that current flowing through its corresponding one of said plurality of solenoid coils has reached a predetermined value;

charge storing means with one end coupled to said reference voltage terminal;

a plurality of second switching means respectively coupled between said one ends of said solenoid coils and the other end of said charge storing means and connected to be turned on and off in response to the driving input signal and the output signals from said current detecting means, respectively; and a plurality of second diode circuits respectively coupled between said other ends of said solenoid coils and said other end of said charge storing means to allow current to flow from said solenoid coil to said charge storing means.

7. An injector driving circuit according to claim 6, further comprising a Zener diode whose cathode is coupled to said other end of said charge storing means and whose anode is coupled to said reference voltage terminal.

8. An injector driving circuit according to claim 6 or 7, further comprising a third diode circuit coupled between said power supply voltage terminal and said other end of said charge storing means to supply said other end of said charge storing means with the power supply voltage applied to said power supply voltage terminal.

9. An injector driving circuit according to claim 6 or 7, wherein each of said current detecting means includes a resistor coupled in series with said solenoid coil and a comparing circuit producing an output signal when a voltage drop at said resistor reaches a predetermined voltage level.

10. An injector driving circuit according to claim 9, wherein each of said second switching means includes a flip-flop circuit producing a first output signal in response to the driving input signal and producing a second output signal in response to the output signal from said comparing circuit, and a switching circuit turned on and off in response to said first and second output signals from said flip-flop circuit, respectively.

* * * * *